(12) United States Patent
Reining (10) Patent No.: US 9,609,429 B2
(45) Date of Patent: Mar. 28, 2017

(54) MICROPHONE

(75) Inventor: Friedrich Reining, Vienna (AT)

(73) Assignee: Knowles IPC (M) SDN BHD, Pulau Pinang (MY)

( * ) Notice: Subject to any disclaimer, the term of this patent is extended or adjusted under 35 U.S.C. 154(b) by 593 days.

(21) Appl. No.: 13/808,075

(22) PCT Filed: Jun. 22, 2011

(86) PCT No.: PCT/IB2011/052736
§ 371 (c)(1),
(2), (4) Date: Jan. 2, 2013

(87) PCT Pub. No.: WO2012/001589
PCT Pub. Date: Jan. 5, 2012

(65) Prior Publication Data
US 2013/0108074 A1    May 2, 2013

(30) Foreign Application Priority Data
Jul. 2, 2010 (EP) ..................................... 10168354

(51) Int. Cl.
*H04R 3/00*     (2006.01)
*H04R 19/00*    (2006.01)
*H04R 19/04*    (2006.01)

(52) U.S. Cl.
CPC ............. *H04R 3/005* (2013.01); *H04R 3/007* (2013.01); *H01L 2224/48091* (2013.01); *H01L 2224/48137* (2013.01); *H01L 2924/1461* (2013.01); *H01L 2924/3025* (2013.01); *H04R 19/005* (2013.01); *H04R 19/04* (2013.01)

(58) Field of Classification Search
CPC .. H04R 3/005; H04R 1/406; H04R 2201/401; H04R 2201/403; H04R 25/407
See application file for complete search history.

(56) References Cited

U.S. PATENT DOCUMENTS

| | | | |
|---|---|---|---|
| 3,980,838 A | 9/1976 | Yakushiji Nobuo et al. | |
| 5,097,712 A | 3/1992 | Gerst et al. | |
| 6,075,867 A * | 6/2000 | Bay et al. | 381/191 |
| 7,190,038 B2 | 3/2007 | Dehe et al. | |
| 7,473,572 B2 | 1/2009 | Dehe et al. | |

(Continued)

FOREIGN PATENT DOCUMENTS

| | | |
|---|---|---|
| DE | 2155026 A1 | 5/1973 |
| EP | 0065746 A2 | 12/1982 |

(Continued)

OTHER PUBLICATIONS

International Search Report and Written Opinion for International Patent Application PCT/IB2011/052736 (Feb. 17, 2012).

(Continued)

*Primary Examiner* — Simon Sing
(74) *Attorney, Agent, or Firm* — Foley & Lardner LLP (57) ABSTRACT

A microphone comprises a sound inlet, a first MEMS microphone structure comprising a first membrane and associated backplate in the path of the sound inlet and a second MEMS microphone structure comprising a second membrane and associated backplate stacked with respect to the first microphone membrane, with an enclosed space between the first and second membranes.

20 Claims, 7 Drawing Sheets

(56) References Cited

U.S. PATENT DOCUMENTS

| | | |
|---|---|---|
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 8,184,845 B2 * | 5/2012 | Leidl et al. ............ 381/369 |
| 8,582,788 B2 * | 11/2013 | Leidl et al. ............ 381/173 |
| 2005/0207605 A1 | 9/2005 | Dehe et al. |
| 2007/0278501 A1 | 12/2007 | Macpherson et al. |
| 2008/0175425 A1 | 7/2008 | Roberts et al. |
| 2008/0192963 A1 | 8/2008 | Sato |
| 2008/0247535 A1 * | 10/2008 | Li .............. H04M 9/082 379/406.08 |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0136059 A1 * | 5/2009 | Inoda .............. H04R 1/406 381/92 |
| 2009/0152655 A1 * | 6/2009 | Laming .......... B81C 1/00246 257/416 |
| 2009/0180655 A1 | 7/2009 | Tien et al. |
| 2010/0046780 A1 | 2/2010 | Song |
| 2010/0052082 A1 | 3/2010 | Lee et al. |
| 2010/0054495 A1 * | 3/2010 | Harney .............. H04M 1/035 381/92 |
| 2010/0128914 A1 | 5/2010 | Khenkin |
| 2010/0135514 A1 * | 6/2010 | Hinke .............. H04R 19/04 381/355 |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |

FOREIGN PATENT DOCUMENTS

| | | |
|---|---|---|
| EP | 1599067 A2 | 11/2005 |
| GB | 2044583 A1 | 10/1980 |

OTHER PUBLICATIONS

Extended European Search Report for Pat. Appl. No. EP10168354.8 (Feb. 17, 2012).

Bay J. et al, "Design of a Silicon Microphone with Differential Read-out of a Sealed Double Parallel-plate Capacitor," The 8th International Conference on Solid State Sensors and Actuators and Eurosensors IX, Stockholm, Sweden (Jun. 25, 1995).

* cited by examiner

MICROPHONE

CROSS REFERENCE TO RELATED APPLICATIONS

This application is a National Phase of PCT International Application No. PCT/IB2011/052736, filed Jun. 22, 2011, which claims priority to European Patent Application No. 10168354.8, filed Jul. 2, 2010, the entire disclosure of which is herein expressly incorporated by reference.

BACKGROUND OF THE INVENTION a. Field of the Invention

This invention relates to microphones.

b. Background Art

Loudspeakers and microphones essentially comprise a movable diaphragm or other member which provides conversion between a sound pressure wave and an electrical signal.

Microphones are moving from typical analogue microphones to digital microphone modules. These microphone modules typically consist of a sensor manufactured in a micro-electro-mechanical system (MEMS) process and an analogue to digital converter (ADC). The output of the ADC (typically a sigma delta type converter) is a PDM (pulse density modulation) stream that outputs the data to a baseband processor.

This invention is of particular interest for MEMS microphones, which due to their miniaturised size, are particularly prone to signal distortion or damage in the presence of high sound pressure levels. However, the invention is applicable to capacitive microphones generally, such as electret condenser microphones (ECMs).

The acoustical reference levels of 94 dB Sound Pressure Level ("SPL") results in a typical voltage from a MEMS microphone sensor of 5 mV @ 94 dBSPL. A required signal to noise ratio for the module is typically greater than 60.5 dB. This means 64 dB for the sensor and 64 dB for the ADC.

When there is background noise, particularly wind noise, high sound pressures levels can occur, for example above 140 dBSPL, which is at the limit of the physical capability of the MEMS microphone before damage may occur. This wind noise can also introduce non-linearity to the microphone signal. Removing the noise afterwards in a noise canceller cannot be achieved without distortion, since the signals are distorted and non-linear.

There is therefore a need to provide wind noise rejection. In addition, the demands on signal to noise ratio ("SNR") are always increasing. It is expected that SNR of greater than 66 dB will be demanded in future, as well as wind noise enhancement.

The limits to improving the SNR derive both from the mechanical design of the pressure sensor and the electric circuit design.

The sensor presents a limitation to the SNR by virtue of the achievable compliance of membrane, and the required small size of the sensor, for example the small distance between the membrane and the back electrode, and the bias voltage to be used. These parameters are of course interdependent and optimised in actual design. The components used in the electronic circuitry determine the SNR which can be achieved in the electrical signal processing.

Wind noise affects the overall audio performance basically in two ways. Firstly, sound evolves very close to the membrane when a turbulent air flow interacts with holes and edges found in the sound inlet path of the microphone. Thus, sound is generated directly at the microphone, which can therefore dominate over the more distant sound being recorded. Secondly, turbulent air affects the operating point of the membrane and therefore introduces non-linearity to the microphone signal.

It is known to use mechanical pop and wind noise shields, but these require extra space which may not be available in some applications. These devices transform the air flow to create as many as possible uncorrelated sound sources by using a fine grid or foam, to spread the flow of energy between multiple sound sources which effectively have different phases over time. This reduces the wind noise impact. The microphone can then remain in the linear operating range, and de-noising algorithms can function properly.

If there is insufficient space for pop or wind noise shields, algorithmic solutions are also known. These involve echo cancellation or noise suppression, mostly in the digital domain, and operate on the one-dimensional microphone signal. These can perform well as long as the transducers operate in the linear range.

However, in the case of non-linearities, introduced by turbulence on the membrane, these algorithms fail to work because of the one-dimensional nature of the microphone signal. In particular, it is difficult to estimate the non-linearities practically latency free.

Wind noise levels can easily reach 140 dB SPL. Measurements on microphones show that non-linear behaviour can be expected for most microphone designs at these levels of sound pressure.

BRIEF SUMMARY OF THE INVENTION

According to the invention, there is provided a microphone comprising:

a sound inlet;

a first microphone structure comprising a first membrane and associated backplate in the path of the sound inlet;

a second microphone structure comprising a second membrane and associated backplate stacked with respect to the first microphone structure, with an enclosed space between the first and second membranes, wherein the microphone structures are back to back, such that movement of one membrane towards its associated backplate is accompanied by movement of the other membrane away from its associated backplate.

The invention provides two microphone structures which are in series with regard to the sound pressure inlet, and the two membranes are sealed acoustically. There is only one sound inlet on one side of the pair of membranes.

This arrangement means the two membranes will move in parallel. Each structure generates its own microphone signal, and the use of two microphone signals in this way enables improved cancellation of wind noise by detecting increased non-linearity in the sensor signal. Furthermore, an improvement in SNR (with regard to electrical noise of the microphone circuitry) and corresponding reduction in total harmonic distortion ("THD") is made possible. The invention also enables implementation of a sticking detection process and dynamic range augmentation for very high SPL.

The back plate of each microphone structure is a back electrode, and the capacitance resulting from the spacing between the membrane and back electrode is detected, for example as a change in voltage for a constant charge. The back to back arrangement gives two signals which are 180 degrees out of phase. This enables simple signal processing.

In one example, the first microphone is provided on a first semiconductor die, the second microphone is provided on a second semiconductor die, and the first and second semiconductor dies are bonded together. They can be bonded together using a laminate structure which carries connection lines. This enables existing microphone designs to be used, and simply coupled together. However, the double-membrane design can be implemented as part of a single semiconductor die.

The microphone preferably comprises a signal processor for combining the two microphone signals to generate the microphone output. For example, the signal processor can subtract one microphone signal from the other microphone signal. Because the signals are 180 degrees out of phase, this results in a doubling of the sound signal, therefore increasing the signal to noise ratio of the electrical circuitry.

The microphone signals can be combined to detect a non-linear microphone signal response associated with one of the microphone structures. If the signals do not cancel when added, this is indicative of a non-linear response in one of the microphone signals.

Thus, the microphone signals can be added, and it can then be determined that there is a non-linear microphone signal response based on a threshold applied to the added microphone signals. This threshold can be zero, i.e. any non-zero added signal is indicative of non-linearity. However, a low threshold value can be set to prevent false detection of non-linearity.

In one approach, the microphone electrical load can be adjusted based on the detection of the non-linear microphone signal response. This adjustment can implement an adaptive filter.

In another approach, different parts of the microphone signals of the first and second microphone structures can be selected to derive the microphone output signal. The non-linearity can be caused by contact between the membrane and a back electrode. However, this will only apply to one membrane (since the other is deflected in the opposite way), so the parts of the two signals not suffering from membrane contact can be combined.

The signal processor can be adapted to combine the microphone signals of the first and second microphone structures to detect pull-in of the membranes of one or both of the microphone structures. This is based on the change in signal caused by pull-in, which is essentially a change in signal gain, but with substantially a linear response maintained.

The invention also provides a method of detecting sound using a microphone having a sound inlet, the method comprising:

generating a microphone output by combining the microphone signals from a first microphone structure having a first membrane and an associated backplate in the path of the sound inlet and a second MEMS microphone structure having a second membrane and an associated backplate stacked with respect to the first microphone structure, with an enclosed space between the first and second membranes.

BRIEF DESCRIPTION OF THE DRAWINGS

An example of the invention will now be described in detail with reference to the accompanying drawings, in which.

DETAILED DESCRIPTION OF THE INVENTION

The invention provides a microphone which has two microphone membranes in the path of a single sound inlet, with an enclosed space between the first and second membranes. Each membrane generates an associated microphone signal. Thus, the microphone is essentially formed of two microphone structures, but generates mainly a single output based on two highly correlated signals. This arrangement can be used to detect overload for example from wind noise, increase the signal to noise ratio, and be used to provide wind noise cancellation.

The invention will be described in detail with reference to a MEMS microphone design, simply because this is the main application area of interest to the applicant. However, it will be readily understood that the concepts underlying the invention can readily be applied to any capacitive microphone structure.

Figure 1:
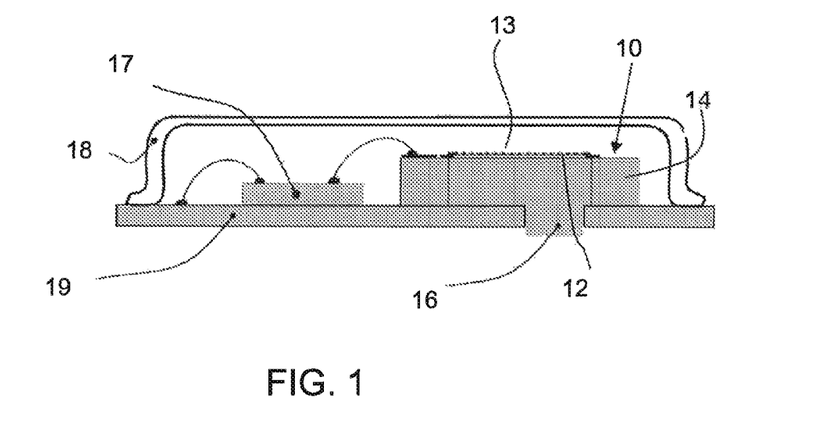
FIG. 1 shows a known MEMS capacitive microphone design.

FIG. 1 shows a known MEMS capacitive microphone design, which has a bottom sound inlet port.

The microphone is formed as an integrated MEMS device 10, in which a membrane 12 is suspended over an opening in the semiconductor substrate 14. A back electrode 13 has perforations to allow the flow of air so that the membrane can move. The membrane is exposed to the sound pressure at the acoustic inlet 16.

The microphone signals are processed by an ASIC 17, and the components of the microphone are sealed in a volume (the so-called back volume) defined by a cap 18 and the laminate 19 which carries the components.

Figure 2:
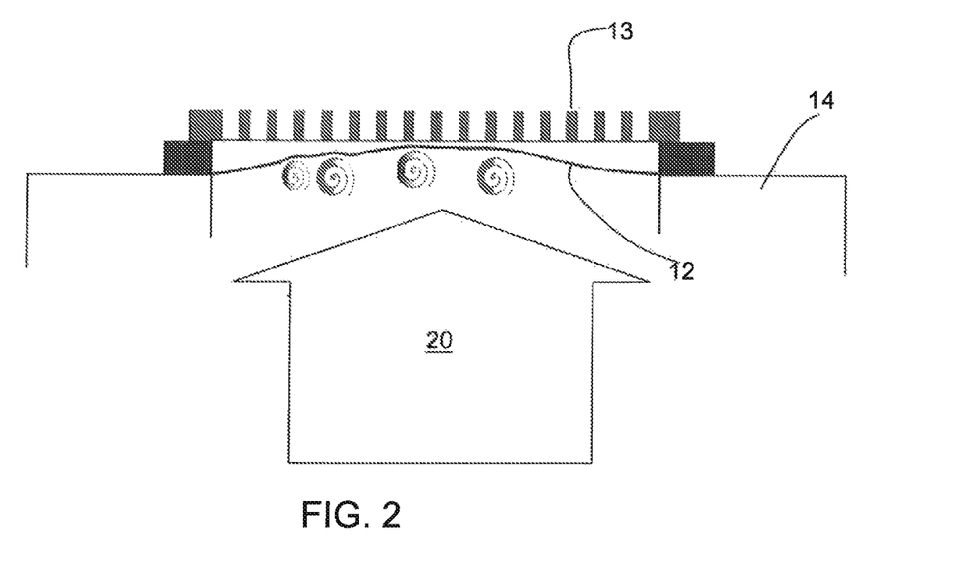
FIG. 2 is used to show the effect of wind noise.

FIG. 2 is used to show the effect of wind noise. The wind noise input 20 causes turbulence at the membrane 12, and this results in non-linearity of the capacitive response to the sound input. It can also result in contact between the membrane 12 and back electrode 13 which again is a cause of non-linearity.

Figure 3:
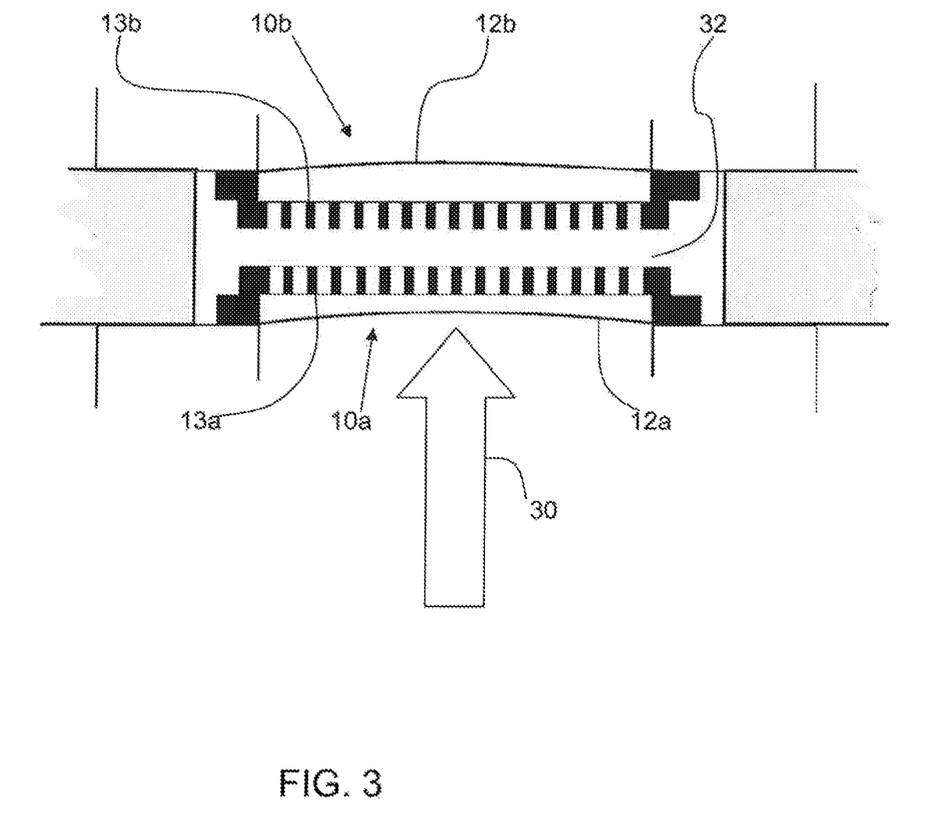
FIG. 3 shows schematically an example of microphone arrangement of the invention.

FIG. 3 shows schematically the arrangement of the invention.

The microphone has a sound inlet at which the acoustic input 30 is received. A first MEMS microphone membrane 12a is in the path of the sound inlet, and a second MEMS microphone membrane 12b is stacked with respect to the first microphone membrane 12a, with an enclosed space 32 between the first and second membranes 12a, 12b.

Each microphone membrane 12a, 12b is associated with a respective backplate 13a, 13b, and the microphone membrane and backplate arrangements are back to back. Thus, there are essentially two microphone structures 10a, 10b which together make up the microphone of the invention. In the example shown, the backplates are adjacent each other and the membranes at the outer sides. Movement of one membrane towards its associated backplate is accompanied by movement of the other membrane away from its associated backplate.

Positive sound pressure increases the capacitance of the first MEMS microphone structure 10a (i.e. the signal associated with the first membrane) and decreases the capacitance of the second MEMS microphone structure 10b.

Figure 4:
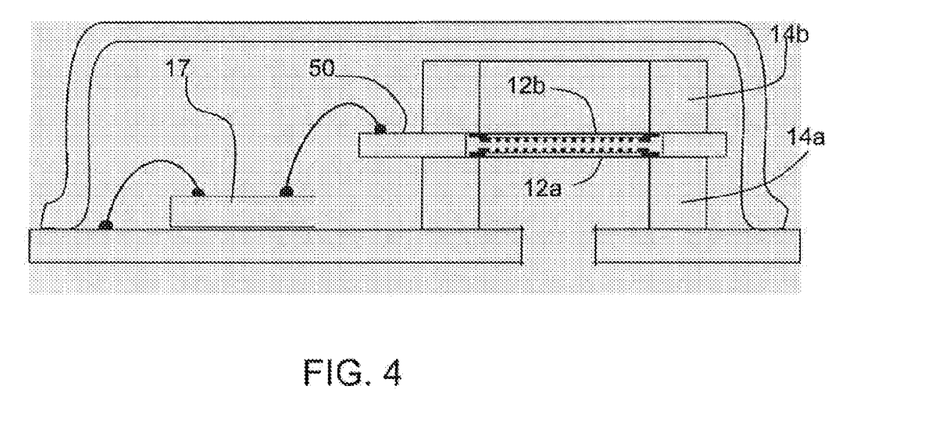
FIG. 4 shows a first implementation of microphone arrangement of the invention.

FIG. 4 shows a first implementation. The first MEMS microphone membrane 12a is part of a first discrete microphone structure having its own die 14a. Similarly, the second MEMS microphone membrane 12b is part of a second discrete microphone structure having its own die 14b. The two semiconductor dies are bonded together using a laminate structure 50 which carries connection lines to the membrane and back electrode contacts. The capacitance between these contacts is measured in known manner to measure the spacing between the membrane and back electrode, which is representative of the sound pressure level. The laminate structure defines the seal between the two microphone structures. This design enables existing MEMS microphone designs to be used, and simply coupled together.

The double-membrane design can be implemented as part of a single semiconductor die.

Figure 5:
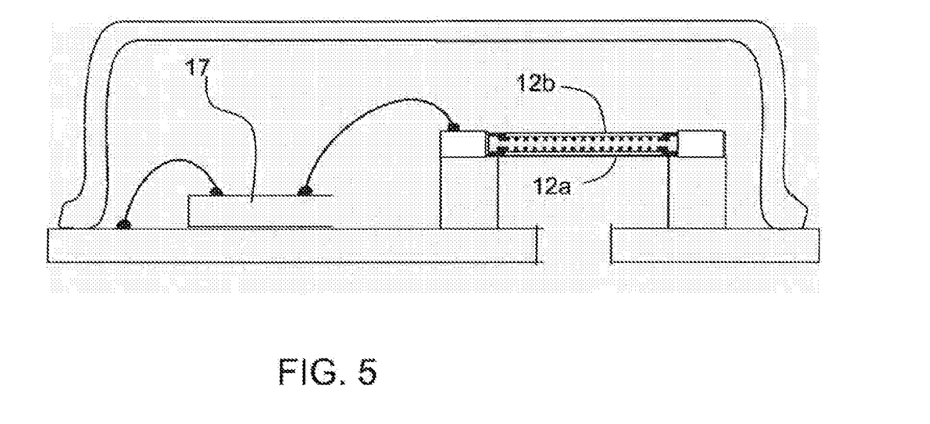
FIG. 5 shows a second implementation of microphone arrangement of the invention.

A first example of single die design is shown in FIG. 5.

In this design, the second membrane 12b and back electrode is formed using additional process steps.

Figure 6:
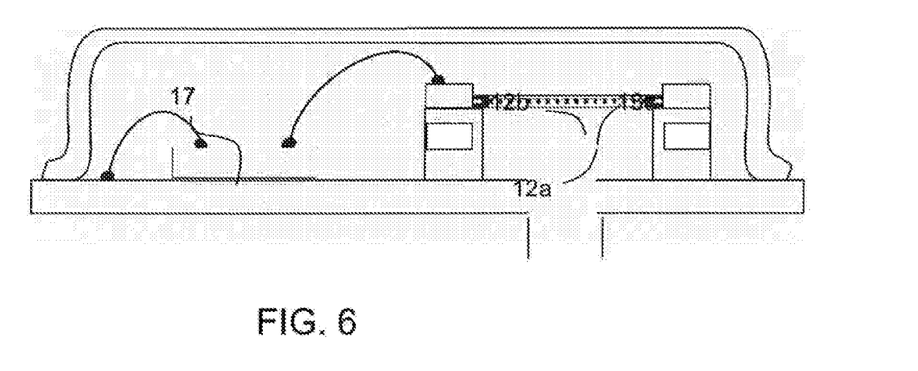
FIG. 6 shows a third implementation of microphone arrangement of the invention.

A second example of single die design is shown in FIG. 6.

In this design, the two back electrodes are merged into one single central back electrode 13c. This can be formed as a stacked capacitor having a conductive bottom surface, a dielectric layer and a top conductive surface. In this arrangement, the back electrode can perform the function of an AC coupling capacitor.

Figure 7:
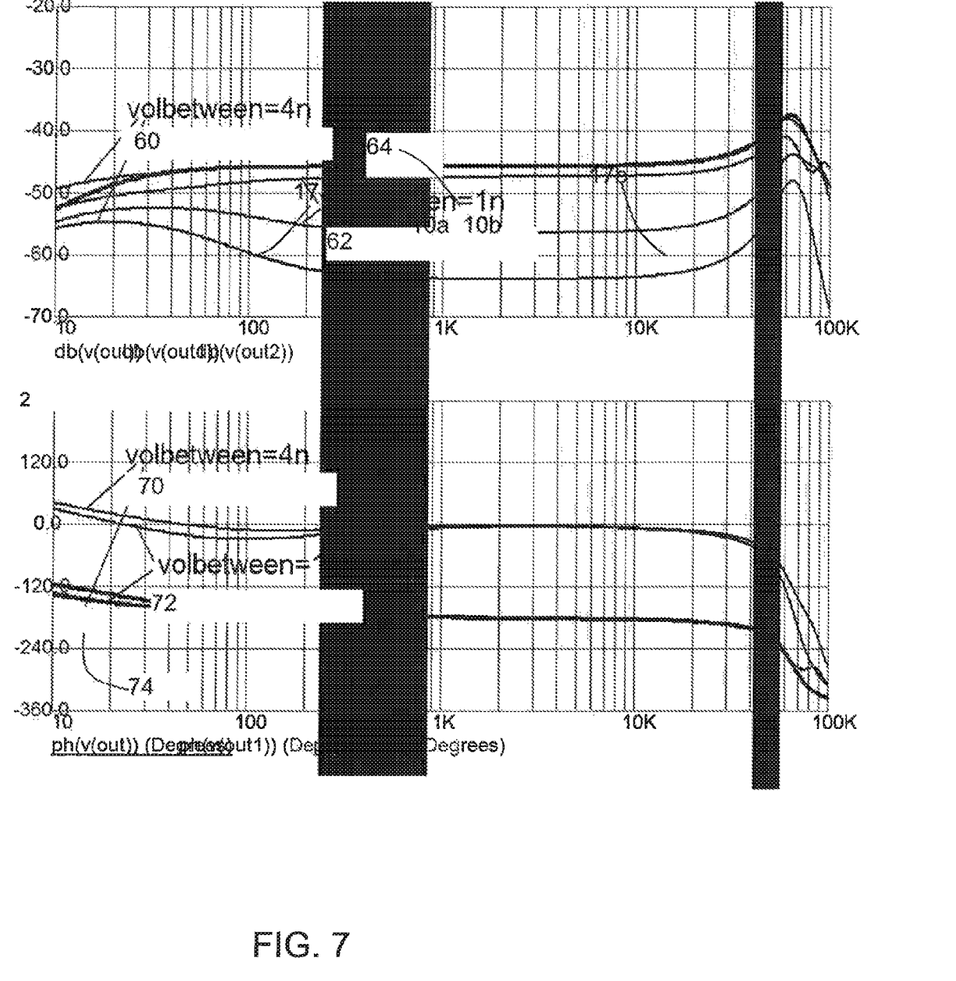
FIG. 7 shows a simulation of the basic implementation of FIG. 4, for two different enclosed volumes between the two membranes.

FIG. 7 shows a simulation of the basic implementation of FIG. 4, for two different enclosed volumes between the two membranes.

The top figure shows the output voltage (on a logarithmic scale) from each microphone structure. Plots 60 show the signals from the two microphone structures when the volume is 4 mm$^3$. Plots 62 show the signals from the two microphone structures when the volume is 1 mm$^3$. Plot 64 is the output of the combined microphone.

The bottom figure shows the output phase from each microphone structure. Plots 70 show the signals from the two microphone structures when the volume is 4 mm$^3$. Plots 72 show the signals from the two microphone structures when the volume is 1 mm$^3$. Plot 74 is the phase output of the combined microphone.

The compliance of the MEMS membranes need to be greater in order to achieve the same SNR as for the single sensor solution.

Figure 8:
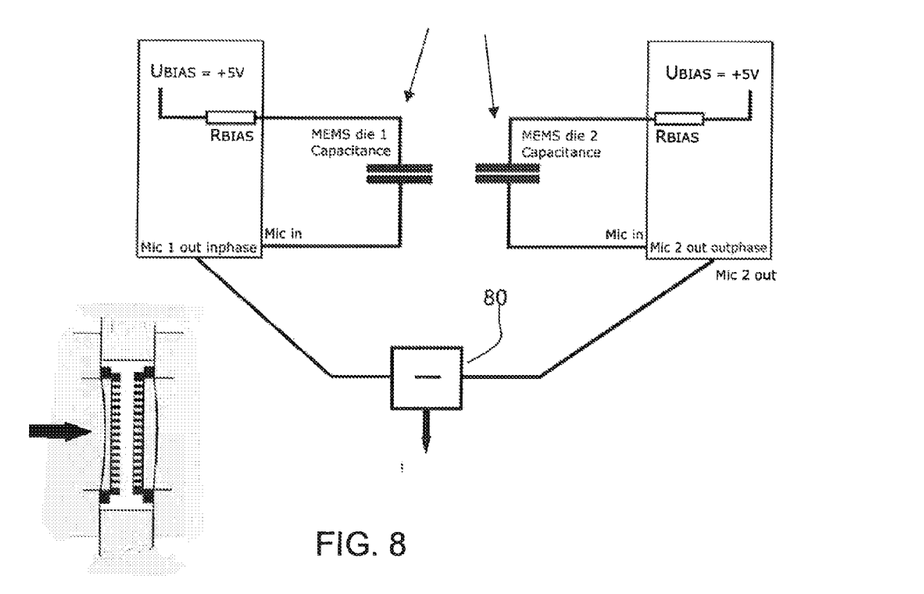
FIG. 8 shows a first circuit arrangement for obtaining signals from the microphone of the invention.

FIG. 8 shows a first circuit arrangement for obtaining signals from the microphone of the invention.

In this implementation, two identical ASICS 17a, 17b are associated with the microphone structures 10a, 10b, and this enables a gain of 3 dB SNR.

Each ASIC includes a bias resistor $R_{BIAS}$ for biasing the membrane and back electrode to the operating voltage.

A signal processor 80 combines the microphone signals associated with the first and second microphone membranes to generate the microphone output. By subtracting the microphone signal associated with one membrane from the microphone signal associated with the other membrane, the signal is increased as they are 180 degrees out of phase.

Figure 9:
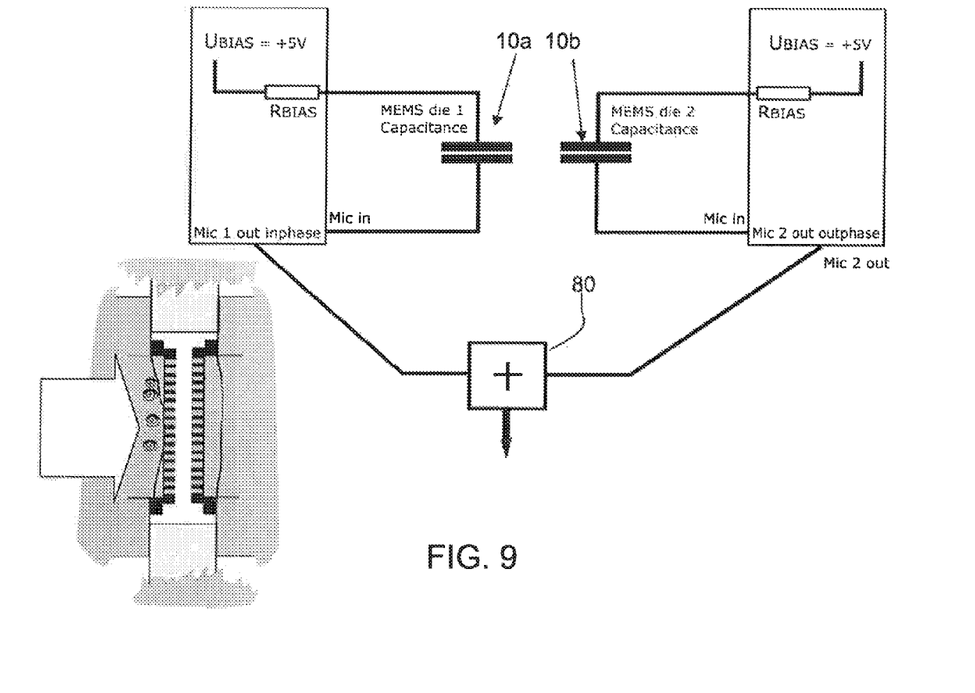
FIG. 9 shows how the circuit can detect if one membrane is touching the back electrode due to turbulence on the membrane.

FIG. 9 shows how the circuit can detect if one membrane is touching the back electrode due to turbulence on the membrane. In this case, the signal processor 80 combines the microphone signals associated with the first and second microphone membranes to detect a non-linear microphone signal response associated with one of the microphone membranes. If the signals from the two microphone structures are not out-of-phase versions of each other, this indicates that one is subject to deformation. By adding the microphone signals associated with the two membranes, it is possible to determine that there is a non-linear microphone signal response, if the sum is non-zero. A threshold may be applied to the added microphone signals to avoid false detection of non-linearities.

The detection of non-linearity can be used to trigger the enhancement of the microphone signal in order to enhance wind noise performance.

A first approach is to use the resistive load of the microphone as a control parameter. The resistance defines the lower frequency limit of the microphone. By reducing this resistance, the cut-off frequency is shifted to higher frequencies. Thus, the load resistance can be altered to implement an adaptive filter for signals that possibly overload the microphone.

The basic condenser microphone principle is based on the formula Q=C*V. If the charge Q is held constant, any change in capacitance (due to membrane movement) results in a change of voltage (the output signal). A constant charge has to be understood as relative to speed of membrane movement or frequency: If the movement is much faster than the RC filter defined by the bias resistance Rbias and the sensor capacitance, charge on the capacitor can be seen as constant, in that recharging due to the changed sensor capacitance is not fast enough. For very low changes (or low frequencies) the bias resistance Rbias can compensate for the changes in sensor voltage resulting in a lower output voltage.

By making the bias resistance dependent on the detected wind signal, the high-pass cut-off frequency can be changed prior to overloading the input stage of the ADC.

A second approach is explained with reference to FIG. 10.

Figure 10:
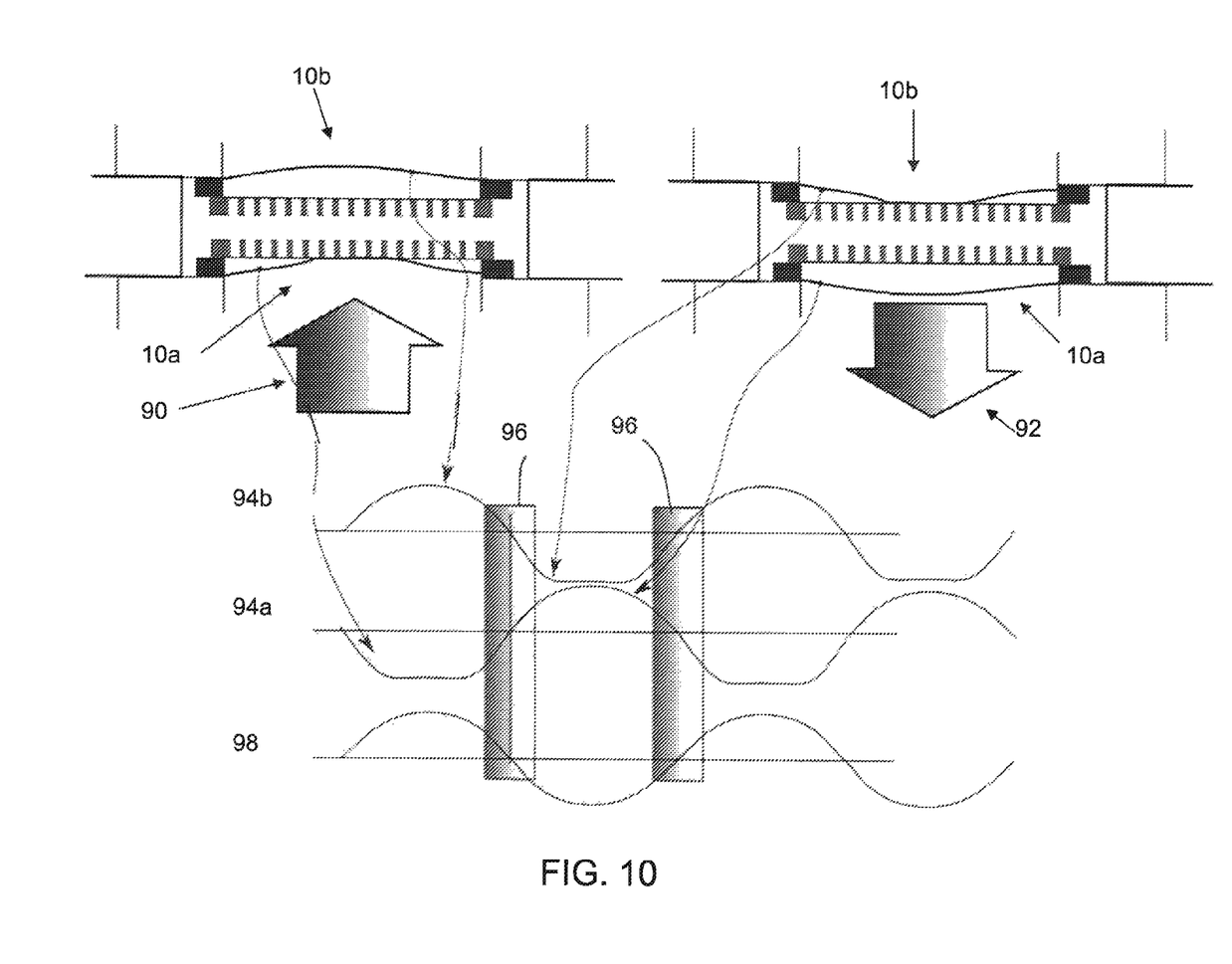
FIG. 10 shows one way to provide wind noise enhancement using the microphone of the invention.

FIG. 10 shows the contact of the membrane with the back electrode which can arise as a result of high sound pressure 90 or low sound pressure 92, and the effect this has on the output from the two microphone structures 10a, 10b. Plot 94a is the capacitance output signal from microphone structure 10a and plot 94b is the capacitance output signal from microphone structure 10b.

Because the contact only affects one membrane at a time, there is always one half cycle of one of the capacitance responses 94a, 94b which has not been affected. Thus, the two MEMS signals can be split into positive and negative signal components in the time domain.

A simple analogue algorithm adds only positive signal components from the microphone structure 10b and subtracts only positive signal components from the microphone structure 10a. The overlap area round zero (area 96) can use half of each signal component to provide a smooth transition.

The resulting calculated signal 98 is less affected by distortion than any of the individual signals. This approach can be used to enlarge the dynamic range of the microphone which then is only limited by the channel capacity of the sigma delta converter used in the ASIC.

This dynamic range increasing approach does not increase the SNR, since only one microphone structure is used at each half period of the signal. However, this approach can be chosen to be used only when there is likely to be signal distortion, for example when the sound pressure level is at around 140 dB. The SNR is not of key interest at this SPL range.

In order to detect when the approach of FIG. 10 should be employed, the detection of a non-linear response (explained with reference to FIG. 9) can be based on following table:

| Sensor 1 | Sensor 2 | Ratio between mic in (+) and mic in (−) |
| --- | --- | --- |
| Operating in linear range | Operating in linear range | Constant value, ~1 |
| Non linear behaviour | Operating in linear range | Not constant |
| Operating in linear range | Non linear behaviour | Not constant |
| Non linear behaviour | Non linear behaviour | Not constant |

The signal "mic in (+)" is the output of the microphone structure that is in phase with the sound input and the signal "mic in (−)" is the output of the microphone structure that is 180 degrees out of phase with the sound input. The ratio is based on the magnitude of the signals (since the ratio in normal operation is −1 as the signals are out of phase).

A non-linear response in one or both microphone structures is detectable based on a non-constant ratio between the microphone structure signals.

The invention also enables an improvement in total harmonic distortion (TDH). There are four root causes for THD in a capacitive microphone:

(i) Variation of Charge Due to Finite Bias Resistor

At low frequencies (<100 Hz in MEMS), the charge on the sensor has time to partially flow back through the bias resistor.

(ii) Non-Piston Membrane

Ideally, the membrane can be modelled as a piston membrane with uniformly distributed charge density. In practice, the excursion shows a parabolic profile. As a result, the charge can redistribute, resulting in variable surface density of charge (iii) Inherent Non-Linearity of Components.

This is the case for any part of the MEMS sensor especially the compliance of the membrane.

(iv) Effect on the Capacitance of the Output Load.

The capacitance is inherently variable, which constrains the validity of AC analysis to small-signals. When there is a load (such as a stray capacitance) the variation of MEMS capacitance can cause non-linear behaviour for high excursion of the membrane.

Figure 11:
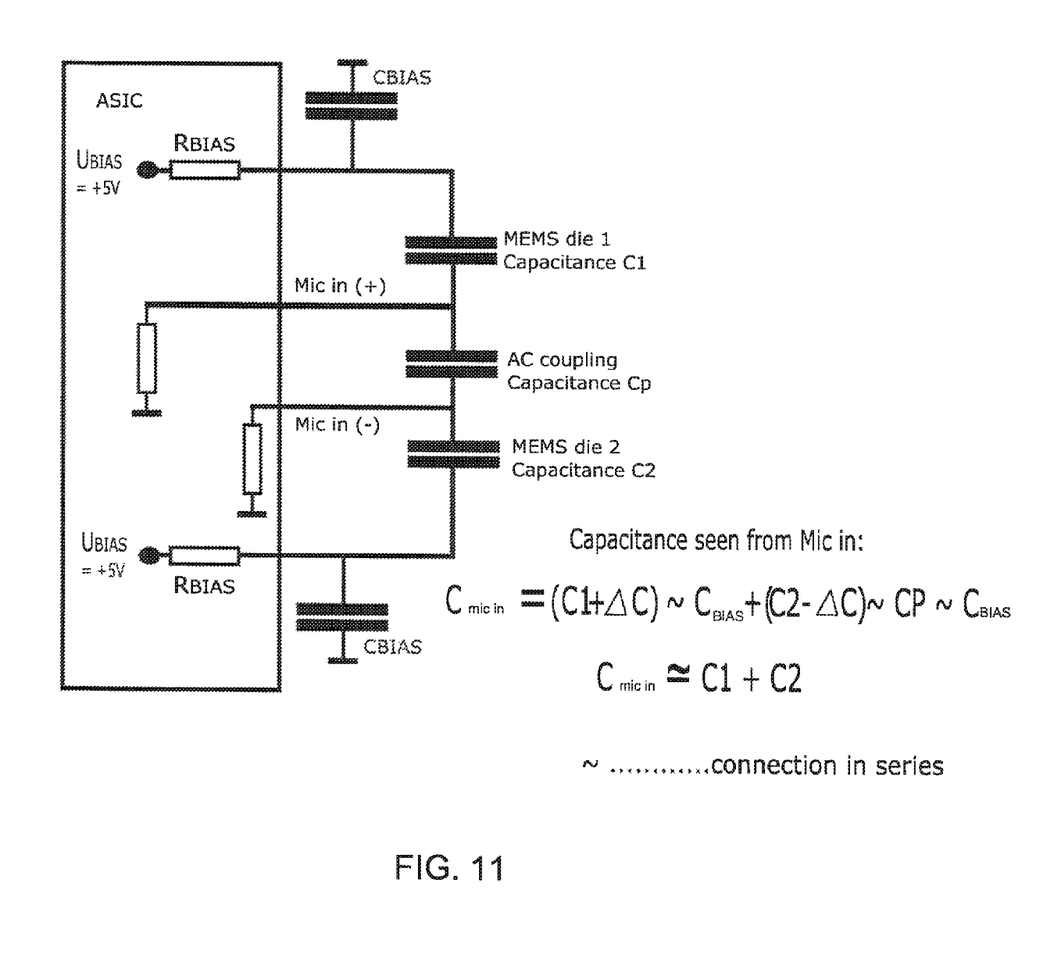
FIG. 11 shows one way to connect both sensors to minimise the capacitance variance

This fourth aspect can be addressed by the design of the invention using the approach shown in FIG. 11.

As explained above, Mic in (+) is the in-phase signal of the two microphone structures (the voltage is in-phase with the sound pressure) whereas Mic in (−) is the out phase signal of the two microphone structures. In FIG. 11, the two MEMS microphone structures are in series with the coupling capacitor between them (Cp). The coupling capacitor is between the read out plates of the two microphone structures (which can be the membrane or the backplate). The opposite terminals are coupled to a bias capacitance.

The bias capacitors are needed to filter the bias voltage and are not an indication of stray capacitances.

As mentioned above, one of the THD sources results from the fact that the capacitances are changing with respect to the sound pressure.

The arrangement of FIG. 11 enables the effect of the change in capacitance of the coupling capacitor to be removed, in that the resulting capacitance at the two microphone inputs (+ and −) are not affected by the changes in capacitance. This improves the electrical signal processing of the microphone signals.

FIG. 11 shows a calculation of the capacitance between the Mic in (+) terminal and ground. A first branch is through C1 and the bias capacitor to ground, and a second branch is through C2, Cp and the bias capacitor to ground. The equation shows that the increase in capacitance (ΔC) of one microphone structure corresponds to an equivalent decreased of the other (because of the back to back arrangement), and that the capacitance to ground for each microphone signal terminal remains constant.

The coupling capacitance is inevitable in this stacked design, providing electric coupling of between the electrodes. However, the arrangement of FIG. 11 means that this coupling does not need to be minimized but can be increased by an additional capacitor (e.g. SMD component connected in parallel) in order not to impact the resulting capacitance seen from the inputs. The resulting value of capacitors connected in series is dominated by the capacitor having the smallest capacitance. A small coupling capacitor would be acting as a stray capacitance and therefore reducing the sensitivity. The use of an additional coupling capacitor prevents this.

As can be seen, the contribution to the total harmonic distortion resulting from the varying sensor capacitance can be eliminated since the ASIC which processes the microphone signals from the two microphone structures always sees a constant input capacitance.

The microphone will experience so-called "pull in", when there is electric field initiated touchdown of the membrane. Switching of the bias voltage releases the membrane from the back electrode after such a pull in event.

Pull in of one sensor affects the signal level of the associated microphone structure. As a result, pull in can be detected in the same way as a non-linearity.

A pull-in reduces the active capacitance of the sensor rapidly but still gives rise to a substantially linear microphone signal. Therefore following table shows how to detect pull-in:

| Sensor 1 | Sensor 2 | Mic in (+)/Mic in (−) | ratio between Mic in (+) and Mic in (−) |
| --- | --- | --- | --- |
| No pull in | No pull in | Normal signal level/Normal signal level | Constant, ~1 |
| pull in | No pull in | low signal/Normal signal level | Constant but level changed |
| No pull in | pull in | Normal signal level/low signal | Constant but level changed |
| pull in | pull in | low signal/low signal | Constant, ~1 |

As shown, pull-in in one microphone structure gives a changed ratio between the signals (both signals are linear but with different gain). In the case of pull-in in both microphone structures, the signals may have the same magnitude but the gain in both has reduced, which shows as a weaker signal from each microphone structure. Thus pull-in can also be detected based on the analysis of the two separate microphone structure signals.

Various modifications will be apparent to those skilled in the art.

The invention claimed is:

1. A microphone comprising:
   a sound inlet;
   a first microphone structure comprising a first membrane and a first backplate in a path of the sound inlet;
   a second microphone structure comprising a second membrane stacked with respect to the first microphone structure, with an enclosed space between the first and second membranes,
   wherein the first and second microphone structures are back to back, such that movement of one of the first membrane towards the first backplate is accompanied by movement of the second membrane away from the first backplate; and
   a signal processor configured to combine microphone signals of the first and second microphone structures to generate a microphone output;
   wherein the signal processor is configured to combine the microphone signals of the first and second microphone structures to detect at least one of:
      a non-linear microphone signal response of one of the first and second microphone structures; and
      pull-in of the membranes of one or both of the first and second microphone structures.

2. The microphone of claim 1, wherein the signal processor is further configured to determine the non-linear microphone signal response based on a threshold applied to the combined microphone signals.

3. The microphone of claim 2, wherein the signal processor configured to:
   adjust a microphone electrical output load based on the detected non-linear microphone signal response.

4. The microphone of claim 2, wherein the threshold is zero.

5. The microphone of claim 1, further comprising:
   a first semiconductor die that comprises the first microphone structure;
   a second semiconductor die that comprises the second microphone structure, wherein the first and second semiconductor dies are bonded together.

6. The microphone of claim 5, wherein the first and second semiconductor dies are bonded together using a laminate structure that carries connection lines.

7. The microphone of claim 1, further comprising:
   a first application-specific integrated circuit (ASIC) connected to the first microphone structure and configured to provide the microphone signal of the first microphone structure to the signal processor; and
   a second ASIC connected to the second microphone structure and configured to provide the microphone signal of the second microphone structure to the signal processor.

8. The microphone of claim 7, wherein the signal processor is further configured to subtract a first microphone signal of the first microphone structure from a second microphone signal of the second microphone structure to generate the microphone output.

9. The microphone of claim 7, wherein the signal processor is further configured to add a first microphone signal of the first microphone structure to a second microphone signal of the second microphone structure to detect the non-linear microphone signal response.

10. The microphone of claim 7, wherein the signal processor is further configured to analyze magnitudes of the microphone signals of the first and second microphone structures to detect the pull-in.

11. The microphone of claim 1, wherein the signal processor is further configured to select different parts of the microphone signals of the first and second microphone structures to derive the microphone output based on the detected pull-in.

12. A method of detecting sound using a microphone having a sound inlet, the method comprising:
   generating a microphone output by combining microphone signals from a first microphone structure and a second microphone structure, wherein the first microphone structure comprises a first membrane and a first backplate in a path of the sound inlet, and wherein the second microphone structure comprises a second membrane stacked with respect to the first microphone structure, with an enclosed space between the first and second membrane;
   detecting a non-linear microphone signal response associated with one of the first and second microphone structures; and
   performing one of:
      adjusting a microphone electrical output load; and
      selecting different parts of the microphone signals of the first and second microphone structures to derive the microphone output.

13. The method of claim 12, wherein the microphone signals of the first and second microphone structures are 180 degrees out of phase.

14. The method of claim 13, wherein generating the microphone output comprises subtracting a first microphone signal of the first microphone structure from a second microphone signal of the second microphone structure.

15. The method of claim 12, wherein detecting the non-linear microphone signal response includes:
   adding a first microphone signal of the first microphone structure to a second microphone signal of the second microphone structure; and
   comparing a sum of the first and second microphone signals to a threshold.

16. The method of claim 15, wherein the threshold is zero.

17. The method of claim 12, further comprising:
   analyzing magnitudes of the microphone signals of the first and second microphone structures to detect pull-in of membranes of one or both of the first and second microphone structures; and
   selecting different parts of the microphone signals of the first and second microphone structures to derive the microphone output based on the detected pull-in.

18. The method of claim 17, wherein selecting different parts of the microphone signals comprises selecting positive and negative signal components in a time domain, and wherein to the method further comprises:
   adding the positive signal components from the microphone signals of one of the first or second microphone structure; and
   subtracting the negative signal components from the microphone signals of the other microphone structure.

19. The method of claim 12, wherein the first microphone structure is provided on a first semiconductor die, wherein the second microphone structure is provided on a second semiconductor die, and wherein the first and second semiconductor dies are bonded together.

20. The method of claim 12, wherein the microphone performs adjusting the microphone electrical output load.

* * * * *